(12) United States Patent
Wolf et al.

(10) Patent No.: US 12,506,283 B1
(45) Date of Patent: Dec. 23, 2025

(54) NON-PLANAR PRINTED CIRCUIT BOARD (PCB) INTERPOSER FOR DOUBLY CURVED CONFORMAL ANTENNA ARRAY

(71) Applicant: Rockwell Collins, Inc., Cedar Rapids, IA (US)

(72) Inventors: Jeremiah D. Wolf, Atkins, IA (US); James B. West, Cedar Rapids, IA (US); Jiwon L Moran, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 126 days.

(21) Appl. No.: 18/386,418

(22) Filed: Nov. 2, 2023

(51) Int. Cl.
*H01Q 23/00* (2006.01)
*H01Q 1/22* (2006.01)
*H05K 1/03* (2006.01)
*H05K 1/11* (2006.01)

(52) U.S. Cl.
CPC .......... *H01Q 23/00* (2013.01); *H01Q 1/2225* (2013.01); *H05K 1/0393* (2013.01); *H05K 1/111* (2013.01); *H05K 1/115* (2013.01)

(58) Field of Classification Search
CPC ............ H01Q 23/00; H01Q 1/22; H01K 1/03; H01K 1/11; H05K 1/11
See application file for complete search history.

(56) References Cited

U.S. PATENT DOCUMENTS

| | | |
|---|---|---|
| 3,697,998 A | 10/1972 | Schaufelberger |
| 5,276,452 A | 1/1994 | Schuss et al. |
| 6,947,008 B2 | 9/2005 | Tillery et al. |
| 8,743,015 B1 | 6/2014 | West et al. |
| 9,991,607 B1 | 6/2018 | West et al. |
| 10,381,743 B2 | 8/2019 | Bialer et al. |
| 10,418,723 B1 | 9/2019 | Livadaru et al. |
| 10,454,177 B2 | 10/2019 | Kozyrev |
| 10,673,148 B1 | 6/2020 | West |
| 10,764,666 B1 * | 9/2020 | Napoles .................. H01Q 7/00 |
| 11,064,602 B1 * | 7/2021 | Wolf ..................... H05K 3/368 |
| 11,309,618 B2 | 4/2022 | Säily et al. |

(Continued)

FOREIGN PATENT DOCUMENTS

| | | |
|---|---|---|
| EP | 0271778 A2 | 6/1988 |
| EP | 2382687 A1 | 11/2011 |
| WO | 2023018860 A1 | 2/2023 |

*Primary Examiner* — Thien M Le
(74) *Attorney, Agent, or Firm* — Sulter Swantz IP

(57) ABSTRACT

A conformal interposer assembly for an electronically scanned array (ESA) includes a set of antenna-side conductive pads connected to an antenna element set into a printed circuit board (PCB) and conforming to a shared interconnection geometry, e.g., defining a single-axis, double-axis, or otherwise curved. Feed-side conductive pads are connected to a radio frequency (RF) feed board and likewise conform to a shared interconnection geometry, which may or may not conform to that of the antenna-side pads. Conductive vias conveys energy between the RF feed board and the antenna elements set into the PCB; for example, each conductive via may connect an antenna-side conductive pad and a counterpart feed-side conductive pad. Rigid dielectric interposers are disposed between the PCB and the feed board, providing insulation and physical bridging to the conductive vias and structural rigidity throughout the conformal assembly.

18 Claims, 3 Drawing Sheets

(56) References Cited

U.S. PATENT DOCUMENTS

| | | |
|---|---|---|
| 11,397,284 B2 | 7/2022 | Dabrowski et al. |
| 12,292,219 B2 * | 5/2025 | Helgerson ............. F04D 29/057 |
| 2010/0066631 A1 * | 3/2010 | Puzella ................ H01Q 9/0414 |
| | | 29/601 |
| 2019/0116502 A1 * | 4/2019 | Guo ..................... H01Q 21/065 |
| 2020/0289090 A1 * | 9/2020 | Iwashita ................ A61B 8/483 |
| 2021/0194148 A1 | 6/2021 | West et al. |
| 2021/0367324 A1 | 11/2021 | Kuo et al. |
| 2022/0014243 A1 * | 1/2022 | Hwang ................ H01Q 21/065 |
| 2022/0216903 A1 * | 7/2022 | Roukos ................ H04B 7/0617 |
| 2023/0105182 A1 * | 4/2023 | Lee ........................ H01Q 1/246 |
| | | 343/702 |
| 2023/0395987 A1 * | 12/2023 | Li ......................... H01Q 1/246 |
| 2024/0213656 A1 * | 6/2024 | Liu ..................... H01Q 19/108 |

\* cited by examiner

NON-PLANAR PRINTED CIRCUIT BOARD (PCB) INTERPOSER FOR DOUBLY CURVED CONFORMAL ANTENNA ARRAY

BACKGROUND

Electronically scanned antenna (ESA) arrays may be implemented as a series of layers, e.g., a radiating or slotted layer; a cavity layer; an aperture or coupling layer; and a feed layer (e.g., connected to a feeding network, via which RF energy is provided to the array). Conventionally these layers are arranged so that their cross section is planar, or one-dimensional. While planar ESA arrays (e.g., "brick" or "card" configurations) are known, conformal apertures curving in one or more dimensions (e.g., contoured to curved surfaces) have so far eluded practical implementation. This is in large part due to various compounding complexities associated with mounting beamformer circuits on a conformal structure, or the physical shifting of printed circuit board (PCB) layers associated with forcing the planar construction process into a curved structure.

SUMMARY

In a first aspect, a conformal interposer assembly for an electronically scanned array (ESA) is disclosed. In embodiments, the interposer assembly includes a set of antenna-side conductive pads, each conductive pad connected to an antenna element set into a printed circuit board (PCB). The antenna-side conductive pads conform to a shared interconnection geometry, e.g., defining a single-axis, double-axis, or otherwise curved surface. A set of feed-side conductive pads are connected to a radio frequency (RF) feed board and likewise conform to a shared interconnection geometry, which may or may not conform to that of the antenna-side pads. A set of conductive vias conveys energy between the RF feed board and the antenna elements set into the PCB; for example, each conductive via may connect an antenna-side conductive pad and a counterpart feed-side conductive pad. One or more rigid dielectric interposers are disposed between the PCB and the feed board; the rigid interposer/s insulate each conductive via and bridge two or more conductive vias, providing structural rigidity to the conformal assembly.

In some embodiments, the PCB and its corresponding antenna-side interconnection geometry are planar.

In some embodiments, the feed board and its corresponding feed-side interconnection geometry curve relative to a single axis, e.g., according to a conic section or surface of revolution.

In some embodiments, the feed-side interconnection geometry is cylindrical, paraboloid, hyperboloid, or ellipsoid.

In some embodiments, the feed board and corresponding feed-side interconnection geometry curves relative to two or more axes, e.g., by combining two or more single-axis curved sections.

In some embodiments, the feed board comprises a set of segments, e.g., individually or locally planar segments.

In some embodiments, the conformal assembly includes a single rigid interposer physically bridging and insulating the full set of conductive vias.

In some embodiments, the antenna-side and feed-side interconnection geometries are conformal to each other, but neither geometry is planar.

In some embodiments, the energy conveyed by the conductive vias includes RF energy transmitted by the antenna elements (and conveyed from the feed board), RF energy received from the antenna elements (and conveyed thereby to the feed board), power signals (e.g., DC operating power), or control signals.

In some embodiments, the conformal assembly includes a set of N antenna-side pads and N feed-side pads (e.g., where N is a positive integer), and N conductive vias, such that every Nth conductive via connects an Nth feed-side pad and an Nth antenna-side pad.

In a further aspect, a conformal electronically scanned array (ESA) is also disclosed. In embodiments, the conformal ESA includes one or more printed circuit boards (PCB) conforming to an antenna-side interconnection geometry. A set of ESA antenna elements are set into the PCB, each antenna element configured for transmission and reception of RF energy. A set of antenna-side conductive pads coupled to the antenna elements (e.g., one pad per antenna element) likewise conform to the antenna-side interconnection energy. The conformal ESA includes an RF feed board conforming to a feed-side interconnection geometry, the RF feed board capable of conveying energy to the antenna elements and receiving RF energy received by the antenna elements and conveyed to the RF feed board. A set of feed-side conductive pads are coupled to the feed board. A set of conductive vias connect each feed-side pad to a counterpart antenna-side pad and convey energy between the feed board and the antenna elements. One or more rigid dielectric interposers are disposed between the feed board and PCB, the rigid interposers insulating each conductive via and physically bridging two or more vias to provide structural rigidity throughout the conformal ESA.

In some embodiments, the PCB and its corresponding antenna-side interconnection geometry are planar.

In some embodiments, the feed board and its corresponding feed-side interconnection geometry curve relative to a single axis, e.g., according to a conic section or surface of revolution.

In some embodiments, the feed-side interconnection geometry is cylindrical, paraboloid, hyperboloid, or ellipsoid.

In some embodiments, the feed board and corresponding feed-side interconnection geometry curves relative to two or more axes, e.g., by combining two or more single-axis curved sections.

In some embodiments, the feed board comprises a set of segments, e.g., individually or locally planar segments.

In some embodiments, the conformal assembly includes a single rigid interposer physically bridging and insulating the full set of conductive vias.

In some embodiments, the antenna-side and feed-side interconnection geometries are conformal to each other, but neither geometry is planar.

In some embodiments, the energy conveyed by the conductive vias includes RF energy transmitted by the antenna elements (and conveyed from the feed board), RF energy received from the antenna elements (and conveyed thereby to the feed board), power signals (e.g., DC operating power), or control signals.

In some embodiments, the conformal assembly includes a set of N antenna-side pads and N feed-side pads (e.g., where N is a positive integer), and N conductive vias, such that every Nth conductive via connects an Nth feed-side pad and an Nth antenna-side pad.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
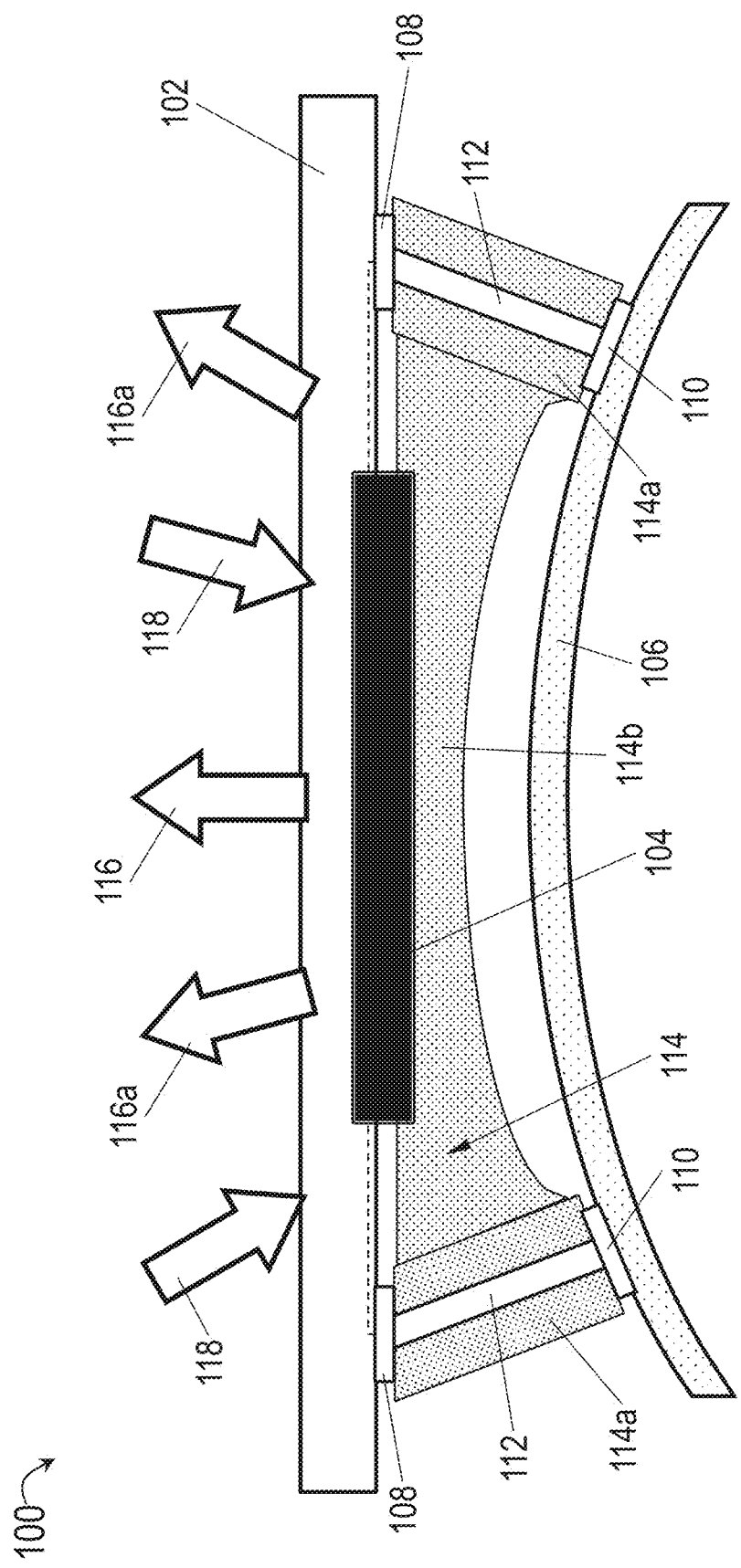
FIG. 1 is a cross sectional illustration of a conformal interposer assembly according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to a conformal ESA array incorporating rigid interposers capable of connecting and physically bridging ESA panels and RF feed boards having different interconnection geometries. For example, rigid interposers according to embodiments of the inventive concepts discloses herein may be incorporated into an ESA array wherein the ESA panels are planar and the RF feed boards are single-axis or double-axis curved. In some embodiments, neither the ESA panels nor the feed boards may be planar.

Referring to FIG. 1, an electronically scanned array (ESA) assembly 100 is shown. The ESA assembly 100 may include printed circuit board 102 (PCB), beamformer circuits 104, RF feed board 106, conductive pads 108, 110, conductive vias 112, and conformal interposer/s 114.

In embodiments, the ESA assembly 100 may operate similarly to a planar or flat-panel ESA in that RF energy 116 may be transmitted (e.g., emitted) by the beamformer circuits 104 and steered in a desired direction 116a, e.g., via phase shifting of individual wavefronts transmitted by multiple adjacent beamformer circuits 104 such that the wavefronts superpose into a plane wave in the desired direction without physically steering the ESA assembly.

In embodiments, the ESA assembly 100 may improve upon flat-panel ESA implementations in that the RF feed board 106 and PCB 102 may be fashioned according to different interconnecting geometries, e.g., wherein one or both of the RF feed board and PCB are nonplanar. For example, the ESA assembly 100 may be coupled to a curved surface, and therefore the interconnection geometry of the RF feed board 106 may conform to the curved surface, while the interconnection geometry of the PCB 102 may remain substantially planar.

In some embodiments, the ESA assembly 100 may incorporate an identical amount of antenna-side and feed-side conductive pads, e.g., N antenna-side pads 108 and N feed-side pads 110, where N is a positive integer, such that each antenna-side conductive pad corresponds to a feed-side conductive pad. For example, each antenna-side conductive pad 108 may be connected to a corresponding feed-side conductive pad 110 by a conductive via 112. In embodiments, to ensure optimal conformity, the number of beamformer circuits 104 set into each PCB 102 (and therefore the number of antenna-side and feed-side pads 108, 110 and the number of conductive vias 112 may be minimized.

In embodiments, the conductive vias 112 may convey energy between the RF feed board 106 and the beamformer circuits 104 set into the PCB 102. For example, the conductive vias 112 may convey transmitted RF energy 116 from the RF feed board 106 for emission by the beamformer circuits 104; similarly, RF energy 118 received by the beamformer circuits may be conveyed via the RF feed board 106 for signal processing. In some embodiments, the conductive vias 112 may likewise convey power signals (e.g., direct-current (DC) operating power, serial-peripheral interface (SPI) control power, grounds) and/or control signals (e.g., SPI control signals) to the beamformer circuits 104.

In embodiments, the ESA assembly 100 may incorporate one or more rigid conformal interposers 114 (e.g., riser cards) disposed between the RF feed board 106 and the PCB 102 to accommodate the differing interconnection geometries of the RF feed board and the PCB. For example, each conformal interposer 114 may incorporate two sets of conductive pads, antenna-side conductive pads 108 connected or coupled to the PCB 102 and feed-side conductive pads 110 connected or coupled to the RF feed board 106. In embodiments, conformal interposers 114 may be fashioned of rigid dielectric materials, e.g., via an additive manufacturing process providing for pad definitions to accommodate antenna-side and feed-side conductive pads 108, 110 at either end of the conductive via 112.

In embodiments, each conformal interposer 114 may incorporate a rigid insulating structure 114a enclosing one or more conductive vias 112. Further, each conformal interposer 114 may physically bridge (114b) two or more conductive vias 112 with additional rigid structural material. For example, the conformal interposer 114 shown by FIG. 1 may bridge 114b two conductive vias 112. With respect to an ESA assembly 100 incorporating a set of N antenna-side conductive pads 108, N feed-side conductive pads 110, and N conductive vias 112, where N is greater than two, the ESA assembly may include multiple conformal interposers, each bridging two (or more) conductive vias; in other embodiments the ESA assembly 100 may incorporate a single conformal interposer 114 insulating (114a) and physically bridging (114b) all N conductive vias.

Figure 2:
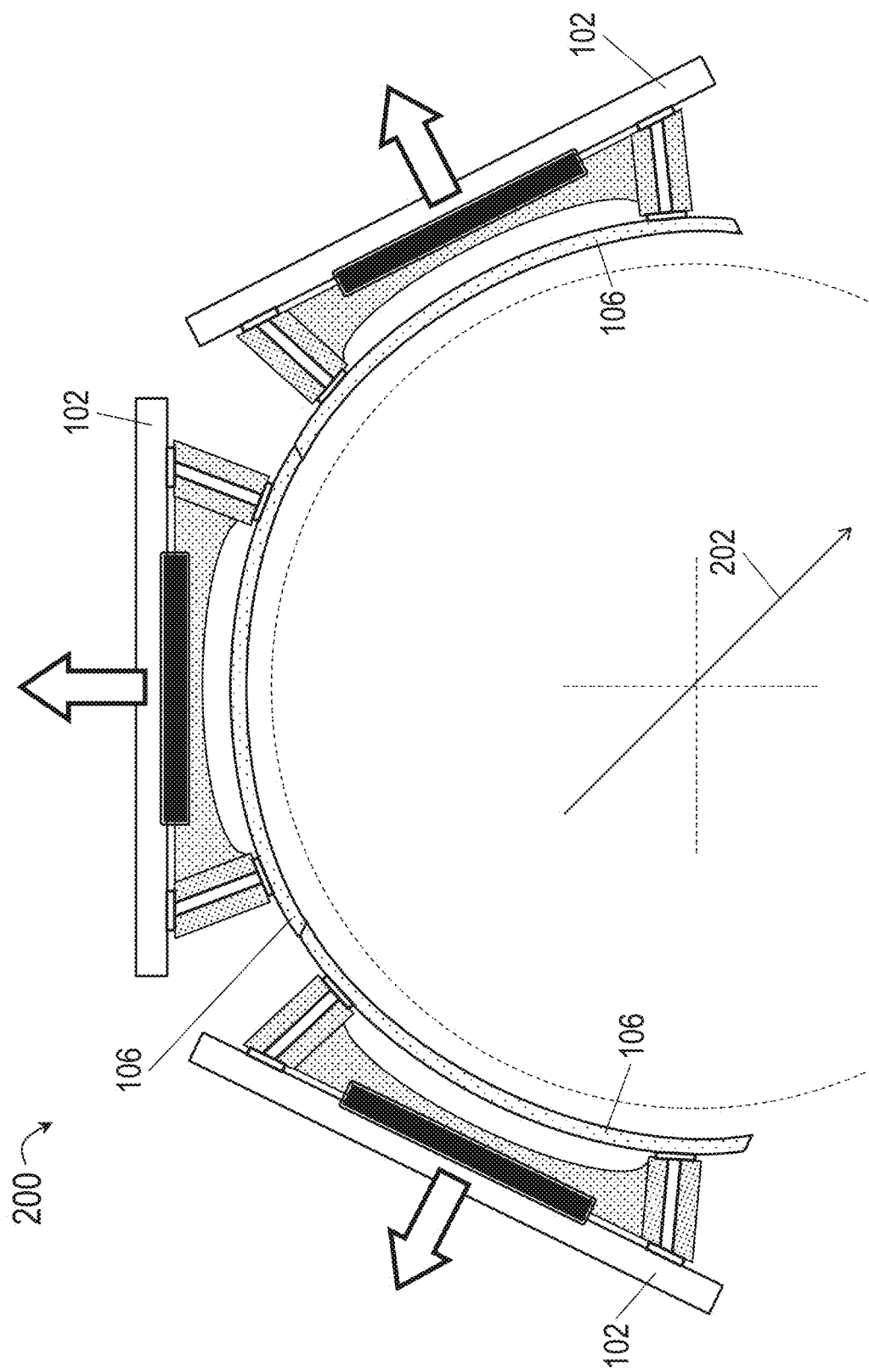
FIG. 2 is a two-dimensional cross-sectional illustration of a doubly curved electronically scanned array (ESA) assembly based on the conformal interposer assembly of FIG. 1.

Referring now to FIG. 2, the ESA assembly 200 is shown.

The ESA assembly 200 may be implemented and may function similarly to the ESA assembly 100 of FIG. 1, except that the ESA assembly 200 may incorporate multiple instances of the planar PCB 102 and non-planar RF feed board 106 to accommodate a broad variety of two-dimensional interconnecting geometries. In embodiments, the RF feed boards 106 may conform to a surface curving according to a single axis 202 (e.g., cylindricals, paraboloids, hyperboloids, ellipsoids, or other surfaces of revolution), or according to two or more axes (e.g., two axes intersecting at an angle). For example, the ESA assembly 200 may incorporate a set of discrete planar PCBs 102; alternatively, the ESA assembly may incorporate one or more PCBs segmented into individually or locally planar portions, e.g., where not all planar portions are coplanar to all other planar portions. Further, while the ESA assembly 100 shown by FIG. 1 may be implemented in larger, single-channel, lower-frequency arrays (e.g., wherein the ESA assembly 100 is a sub-array of a larger electronically scanned array), the ESA assembly 200 (e.g., as well as the ESA assembly 300 as shown by FIG. 3 and described below) may be implemented as a multi-channel ESA assembly incorporating higher frequencies, e.g., a 2×2 array wherein the PCB 102 and beamformer circuits 104 include a four-channel radio frequency integrated circuit (RFIC), a 2×4 array incorporating an eight-channel RFIC, or likewise a multi-channel sub-array of a much larger array.

Figure 3:
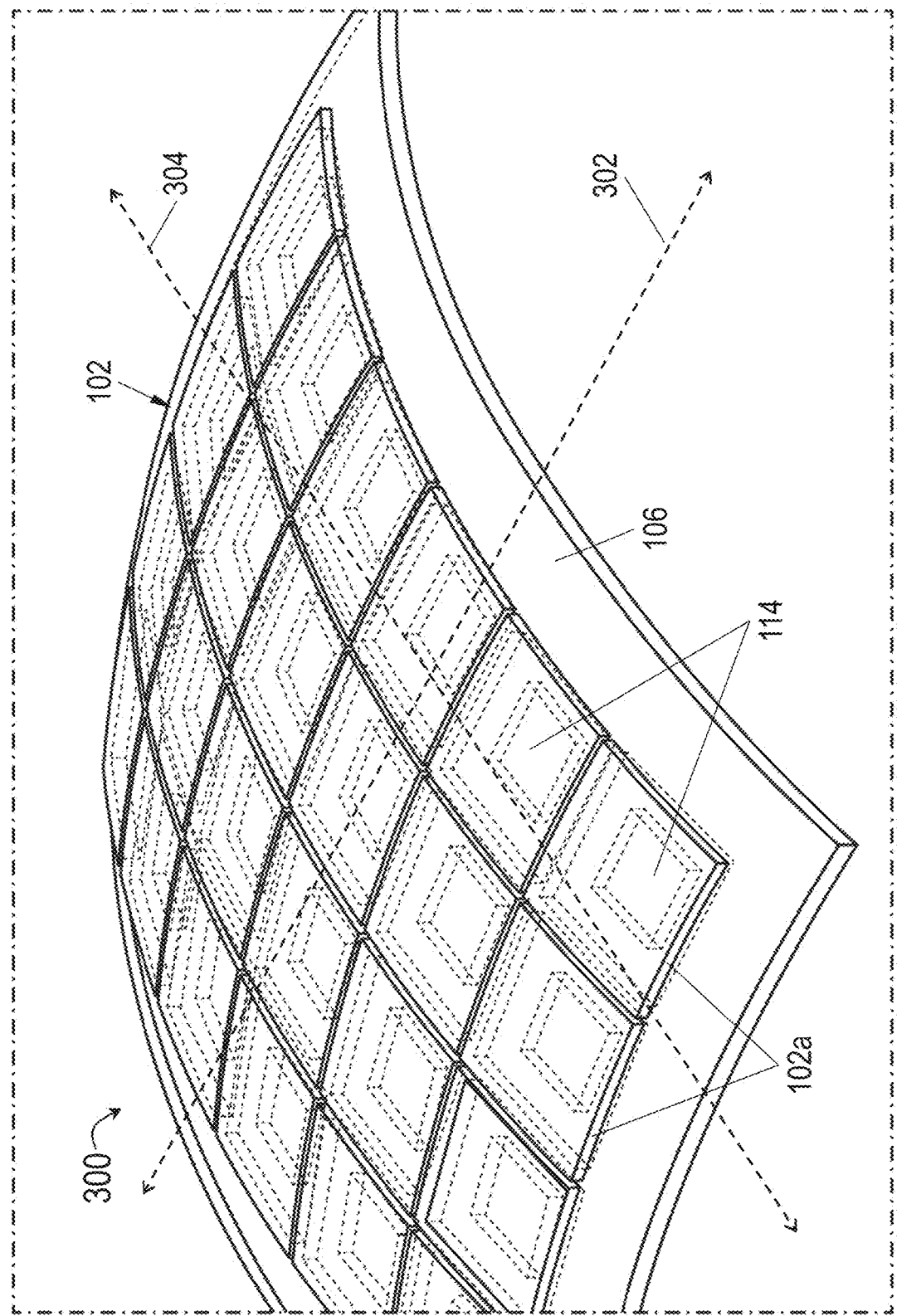
FIG. 3 is a three-dimensional overhead view of a doubly curved ESA assembly according to example embodiments of this disclosure.

Referring now to FIG. 3, the ESA assembly 300 is shown.

In embodiment, the ESA assembly 300 may be implemented and may function similarly to the ESA assemblies 100, 200 of FIGS. 1 and 2, except that the ESA assembly 300 may incorporate PCBs 102 and RF feed boards 106 having interconnection geometries that align with each other while neither is planar. For example, the ESA assembly 300 may be a double-curved conformal array, wherein the PCBs 102 (e.g., PCB segments 102a) and RF feed board 106 both curve according to two axes 302, 304. As shown by FIG. 3, both the PCBs 102 and RF feed board 106 may share a concave interconnection geometry, e.g., to align with a concave surface to which the ESA assembly 300 may be attached.

In embodiments, each PCB segment 102a may be coupled to the underlying RF feed board 106 by a conformal interposer 114. For example, as shown above, each conformal interposer 114 may route conductive vias (112, FIG. 1) between each PCB segment 102a and the RF feed board 106, e.g., via antenna-side conductive pads (108, FIG. 1) and feed-side conductive pads (110, FIG. 1) at either end of each conductive via. Further, each conformal interposer 114 may provide additional mechanical and environmental rigidity and robustness across the ESA assembly 300.

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

We claim:

1. A conformal interposer assembly, comprising:
 a plurality of first conductive pads conforming to a first interconnection geometry, each first conductive pad configured for connection to at least one antenna element set into at least one printed circuit board (PCB);
 a plurality of second conductive pads conforming to a second interconnection geometry, the plural of second conductive pads configured for connection to, and contoured with, a feed board configured for providing energy to the at least one antenna element, wherein the feed board curves according to at least one axis;
 a plurality of conductive vias, each conductive via connecting a first conductive pad to a corresponding second conductive pad, each conductive via configured for conveying energy between the feed board and the at least one antenna element;
 and
 at least one rigid interposer disposed between the PCB and the feed board, each rigid interposer fashioned of at least one dielectric material and configured for:
 insulating at least one conductive via;
 and
 physically bridging at least two conductive vias.

2. The conformal interposer assembly of claim 1, wherein the at least one PCB defines a plane.

3. The conformal interposer assembly of claim 2, wherein the feed board curves according to at least two axes.

4. The conformal interposer assembly of claim 1, wherein the second interconnection geometry is at least one of cylindrical, paraboloid, hyperboloid, or ellipsoid.

5. The conformal interposer assembly of claim 1, wherein the at least one feed board is a single feed board comprising a plurality of segments, wherein each segment curves according to at least one axis.

6. The conformal interposer assembly of claim 1, wherein the at least one rigid interposer is a single rigid interposer physically bridging the plurality of conductive vias.

7. The conformal interposer assembly of claim 1, wherein:
the first interconnection geometry and the second interconnection geometry are mutually conformal;
and
neither the first interconnection geometry nor the second interconnection geometry is planar.

8. The conformal interposer assembly of claim 1, wherein the conveyed energy includes at least one of:
RF energy transmitted by the at least one antenna element;
RF energy received by the at least one antenna element;
control signals;
or
power signals.

9. The conformal interposer assembly of claim 1, wherein:
the plurality of first conductive pads is a plurality of N first conductive pads, wherein N is a positive integer;
the plurality of second conductive pads is a plurality of N second conductive pads;
and
the plurality of conductive vias is a plurality of N conductive vias.

10. A conformal electronically scanned array (ESA) assembly, comprising:
at least one printed circuit board (PCB) conformal to a first interconnecting geometry;
a plurality of antenna elements coupled to the at least one PCB, each antenna element configured for transmission of radio frequency (RF) energy and reception of reflected RF energy;
a plurality of first conductive pads conformal to the first interconnecting geometry, each first conductive pad conductively coupled to at least one antenna element via the at least one PCB;
at least one feed board conformal to a second interconnecting geometry, the at least one feed board configured to transmit energy to the plurality of antenna elements and to receive the reflected RF energy from the plurality of antenna elements, wherein the at least one feed board curves according to at least one axis;
a plurality of second conductive pads conformal to the second interconnecting geometry, each second conductive pad conductively coupled to the at least one feed board;
a plurality of conductive vias, each conductive via conductively connecting a first conductive pad to a corresponding second conductive pad, each conductive via configured for conveying energy between the feed board and the at least one antenna element;
and
at least one rigid interposer disposed between the at least one feed board and the at least one PCB, the at least one rigid interposer fashioned of at least one dielectric material and configured for:
insulating at least one conductive via;
and
physically bridging at least two conductive vias.

11. The conformal ESA of claim 10, wherein the at least one PCB defines a plane.

12. The conformal ESA of claim 11, wherein the at least one feed board curves according to at least two axes.

13. The conformal ESA of claim 10, wherein the second interconnection geometry is at least one of cylindrical, paraboloid, hyperboloid, or ellipsoid.

14. The conformal ESA of claim 10, wherein the at least one feed board is a single feed board comprising a plurality of segments, wherein each segment curves according to at least one axis.

15. The conformal ESA of claim 10, wherein the at least one rigid interposer is a single rigid interposer physically bridging the plurality of conductive vias.

16. The conformal ESA of claim 10, wherein:
the first interconnection geometry and the second interconnection geometry are mutually conformal;
and
neither the first interconnection geometry nor the second interconnection geometry is planar.

17. The conformal ESA of claim 10, wherein the conveyed energy includes at least one of:
RF energy transmitted by the at least one antenna element;
reflected RF energy received by the at least one antenna element;
control signals;
or
power signals.

18. The conformal ESA of claim 10, wherein:
the plurality of first conductive pads is a plurality of N first conductive pads, wherein N is a positive integer;
the plurality of second conductive pads is a plurality of N second conductive pads;
and
the plurality of conductive vias is a plurality of N conductive vias.

* * * * *